(12) United States Patent
Liu et al.

(10) Patent No.: US 7,447,035 B2
(45) Date of Patent: Nov. 4, 2008

(54) HEAT DISSIPATION DEVICE ASSEMBLY

(75) Inventors: Jin-Biao Liu, Shenzhen (CN); Guang Yu, Shenzhen (CN); Shih-Hsun Wung, Taipei Hsien (TW); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 53 days.

(21) Appl. No.: 11/566,015

(22) Filed: Dec. 1, 2006

(65) Prior Publication Data

US 2008/0130239 A1   Jun. 5, 2008

(51) Int. Cl.
*H05K 7/20* (2006.01)
*F28F 7/00* (2006.01)
*H01L 23/34* (2006.01)

(52) U.S. Cl. .................. 361/719; 165/80.3; 165/185; 257/719; 361/704

(58) Field of Classification Search .................. 257/719; 361/700
See application file for complete search history.

(56) References Cited

U.S. PATENT DOCUMENTS

| | | | | |
|---|---|---|---|---|
| 5,052,481 A | * | 10/1991 | Horvath et al. ............... | 165/185 |
| 5,910,884 A | * | 6/1999 | Garza et al. ................ | 361/690 |
| 6,034,874 A | * | 3/2000 | Watanabe .................... | 361/704 |
| 6,134,112 A | * | 10/2000 | LeCornu et al. ............ | 361/720 |
| 6,185,100 B1 | * | 2/2001 | Bentz et al. ................ | 361/704 |
| 6,332,946 B1 | * | 12/2001 | Emmett et al. .............. | 156/299 |
| 6,462,952 B1 | * | 10/2002 | Ubukata et al. ............. | 361/719 |
| 6,583,986 B1 | * | 6/2003 | Storti et al. ................. | 361/704 |
| 7,019,974 B2 | * | 3/2006 | Lee et al. .................... | 361/700 |
| 7,019,976 B1 | * | 3/2006 | Ahmad et al. ............... | 361/704 |
| 7,023,699 B2 | * | 4/2006 | Glovatsky et al. ........... | 361/704 |
| 7,269,014 B1 | * | 9/2007 | Zhao et al. .................. | 361/700 |

* cited by examiner

*Primary Examiner*—Gregory D Thompson
(74) *Attorney, Agent, or Firm*—Frank R. Niranjan

(57) ABSTRACT

A heat dissipation device assembly is mounted on a printed circuit board (80). First and second electronic components (82, 84) are mounted on the printed circuit board. The heat dissipation device assembly includes a first heat sink (10) in thermal contact with the first electronic component, and a second heat sink (20) in thermal contact with the second electronic component. A spring tab (24) is sandwiched between the first and second heat sinks for providing spring force between the first and second heat sinks thus securely mounting the second heat sink on the second electronic component.

17 Claims, 5 Drawing Sheets

HEAT DISSIPATION DEVICE ASSEMBLY

BACKGROUND OF THE INVENTION

1. Field of the Invention

The present invention relates to a heat dissipation device assembly having first and second heat sinks for dissipating heat from main and auxiliary heat-generating electronic components mounted on a printed circuit board.

2. Description of Related Art

The central processing unit (CPU) mounted on the motherboard in a computer is the center of operations of the computer. During the operation of the computer, the CPU produces heat. The heat must be quickly carried away from the CPU during the operation of the computer. Excessively high temperature causes the CPU to work abnormally. In addition to the CPU, MOSFETs (metal oxide semiconductor field effect transistors) near to the CPU are also sources of heat that need to be cooled. The MOSFETs on the motherboard regulate and provide the power for the CPU. The MOSFET delivers the heat to the motherboard and causes the motherboard temperature to increase quickly, thus shortening the life span of the motherboard.

Typically, a related heat sink is mounted on the CPU to remove heat therefrom. However, the related heat sink can only dissipate heat generated by the CPU, and cannot dissipate the heat generated by other heat-generating electronic components, such as MOSFETs next to the CPU.

Furthermore, with less room in the computer, it is needed to solve heat dissipation problem to the CPU and other heat-generating electronic components at the same time in a limited space environment such as a computer enclosure.

Thus, it is desirable to devise a heat dissipation device which can not only dissipate the heat generated by the CPU but also dissipate the heat by other electronic components beside the CPU in a limited space environment.

SUMMARY OF THE INVENTION

According to a preferred embodiment of the present invention, a heat dissipation device assembly is mounted on a printed circuit board. First and second electronic components are mounted on the printed circuit board. The heat dissipation device assembly includes a first heat sink in thermal contact with the first electronic component, and a second heat sink in thermal contact with the second electronic component. A spring tab is sandwiched between the first and second heat sinks for providing spring force between the first and second heat sinks whereby the second heat sink is securely mounted on the second electronic component.

Other advantages and novel features of the present invention will become more apparent from the following detailed description of preferred embodiment when taken in conjunction with the accompanying drawings, in which:

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Reference will now be made to the drawings to describe a heat dissipation device having a fan duct in accordance with a preferred embodiment of the present invention in detail.

Figure 1:
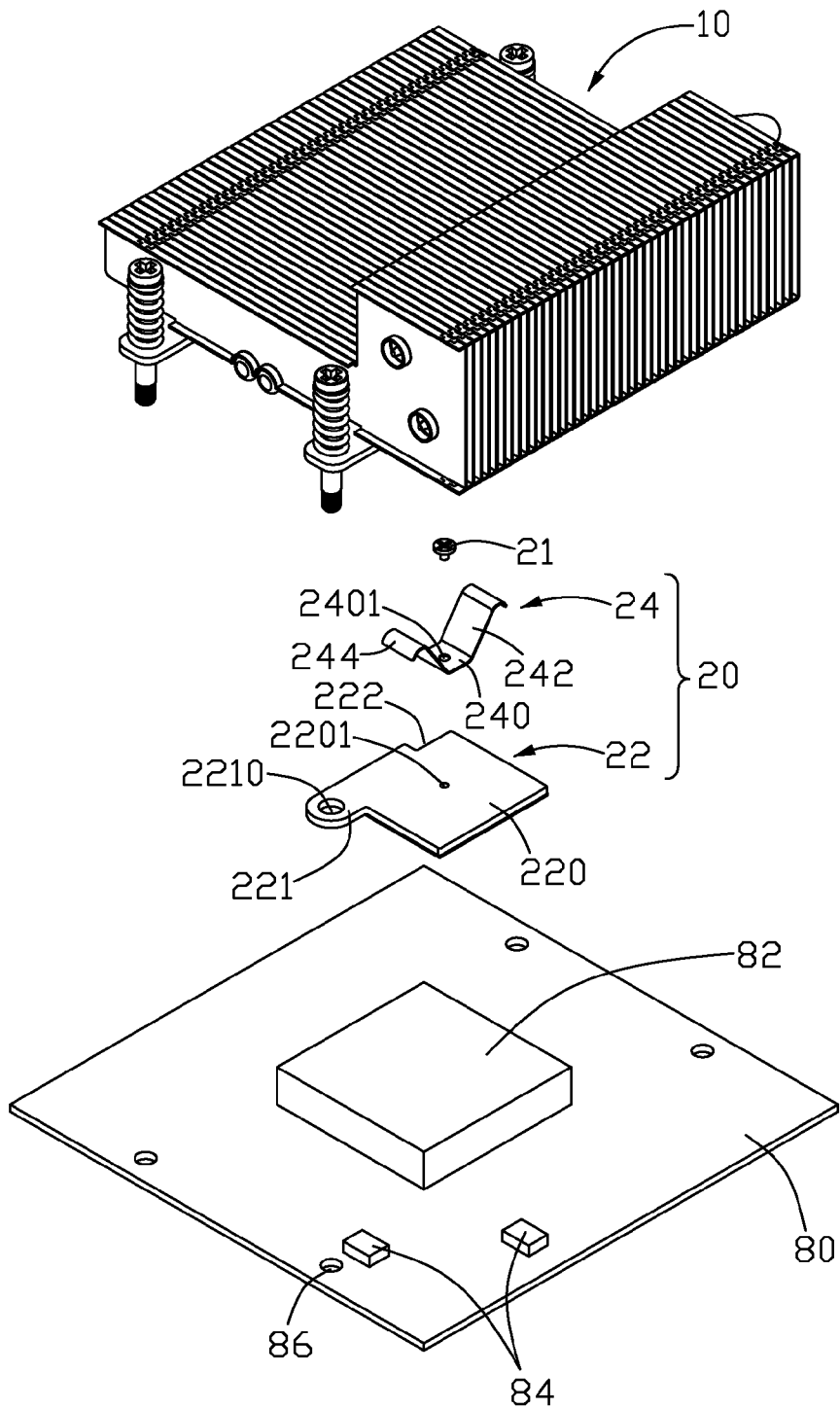
FIG. 1 is a partly exploded isometric view of a heat dissipation device assembly in accordance with a preferred embodiment of the present invention.

FIG. 1 shows a heat dissipation device assembly mounted on a printed circuit board 80. The heat dissipation device comprises a main heat sink 10 and a second heat sink 20. A CPU 82 is mounted on a center of the printed circuit board 80. The main heat sink 10 is mounted on the CPU 82 for dissipating heat generated by the CPU 82. A pair of MOSFETs 84 are mounted on the printed circuit board 80 near to the CPU 82. The second heat sink 20 is mounted on the MOSFETs 84 for dissipating heat generated by the MOSFETs 84.

Figure 2:
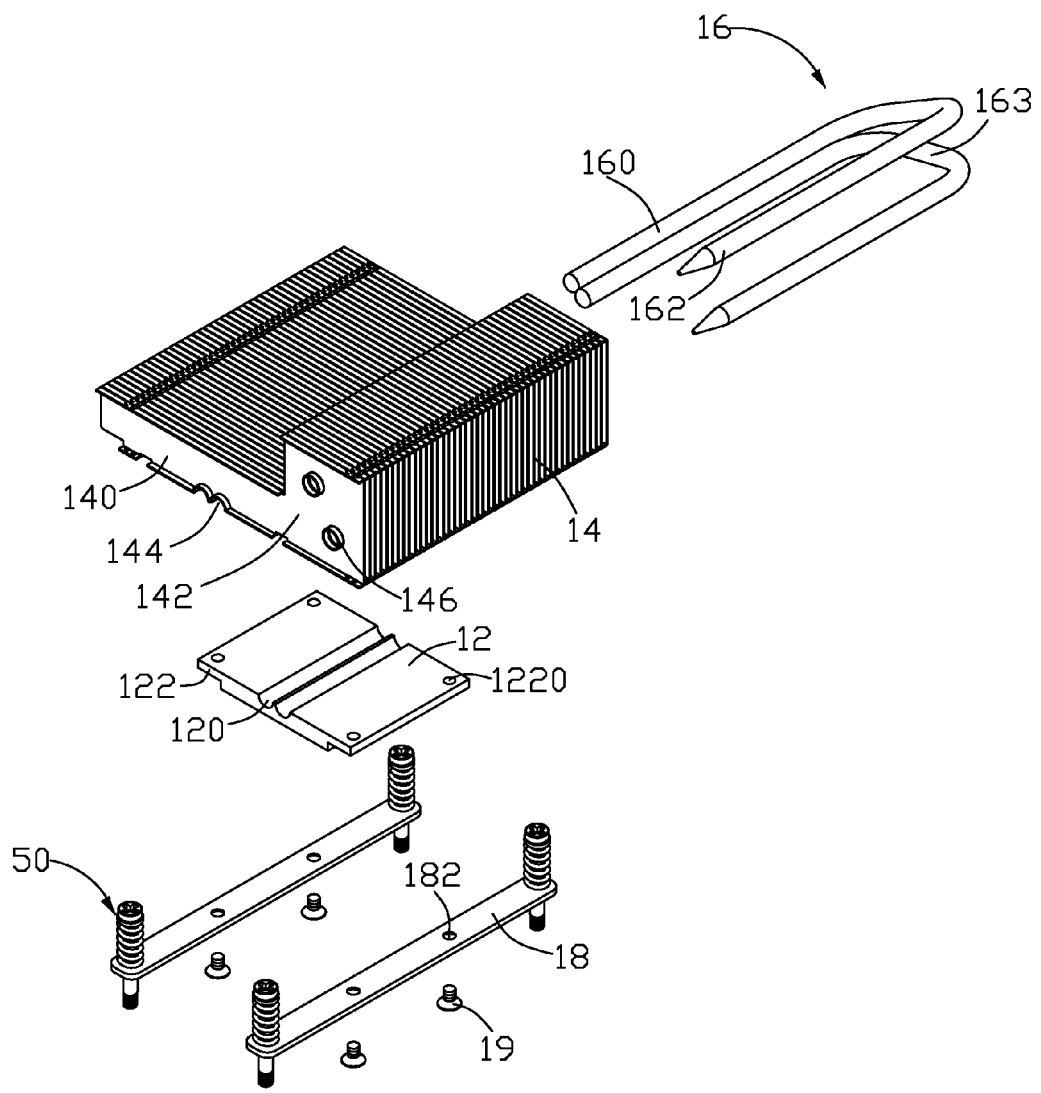
FIG. 2 is an exploded isometric view of a main heat sink of the heat dissipation device assembly of FIG. 1.

Also referring to FIG. 2, the main heat sink 10 comprises a base 12, a plurality of fins 14 attached to the base 12 and two heat pipes 16 connecting the base 12 and the fins 14. A pair of locking members 18 is used for engaging with the base 12 and securing the main heat sink 10 to the printed circuit board 80.

The base 12 is a metal plate having a high heat conductivity, and has a rectangular configuration for contacting with the CPU 82. The base 12 defines two parallel straight grooves 120 in a top portion thereof for receiving the heat pipes 16. The grooves 120 are located in a central area of the base 12. The base 12 defines two undercuts (not labeled) in opposite sides of a bottom portion thereof to form two locking portions 122 for engaging with the locking members 18. The undercuts are aligned parallel to the grooves 120. Each locking portion 122 defines two threaded holes 1220 therein at opposite ends thereof.

The fins 14 has an L-shaped configuration. The fins 14 are oriented perpendicular to the base 12 and parallel to each other. The fins 14 comprise a first portion 140 and a second portion 142 connecting with one side of the first portion 140, and the second portion 142 is higher than the first portion 140. The first portion 140 defines two adjoining slots 144 at a bottom thereof. The second portion 142 of the fins 14 defines a pair of separate through holes 146 therein.

The heat pipes 16 are U-shaped. The heat pipes 16 comprise horizontal evaporating portions 160, condensing portions 162 parallel to the evaporating portions 160 and adiabatic portions 163 connecting the evaporating portions 160 and the condensing portions 162. The evaporating portions 160 are received in channels (not labeled) formed by the slots 144 of the fins 14 incorporating the grooves 120 of the base 12 and the condensing portions 162 are received in the through holes 146 of the second portion 142 of the fins 14, when the fins 14 are stacked together and mounted onto the base 12.

Each locking member 18 has an elongated configuration, engaging with the corresponding locking portion 122 of the base 12. The locking member 18 defines a pair of mounting holes (not labeled) at opposite ends thereof. A pair of locating holes 182 are defined in the locking member 18 and located between the two mounting holes, corresponding to the threaded holes 1220 of the base 12. Screws 19 are extended through the locating holes 182 and threadedly engaged in the threaded holes 1220 of the base 12, thereby securing the locking members 18 to the base 12. A pair of fasteners 50 are extended through the mounting holes of the locking members 18 to engage with a retainer (not shown) below the printed circuit board 80.

Figure 3:
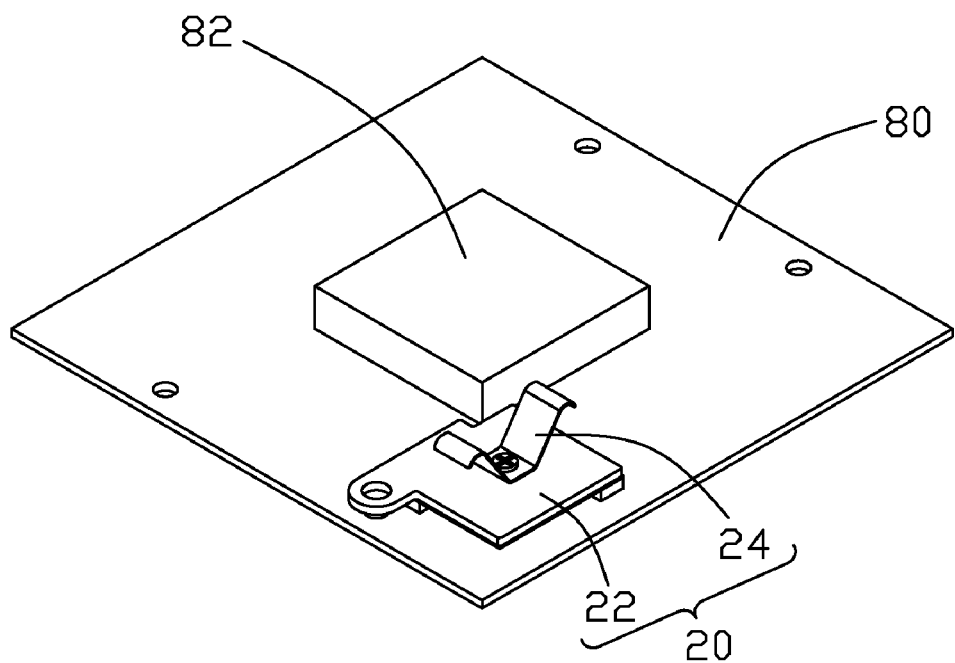
FIG. 3 is an assembled view of a second heat sink of the heat dissipation device assembly of FIG. 1, wherein the second heat sink is mounted on a printed circuit board.

Referring to FIGS. 1 and 3, the second heat sink 20 mounted on the MOSFETs 84 near to the CPU 82 comprises a heat spreader 22 and a spring tab 24 mounted on the heat spreader 22. The heat spreader 22 has a square base portion 220 and a leg 221 extending horizontally and outwardly from a corner of the base portion 220. A central hole 2201 is defined in the base portion 220 of the heat spreader 22. A through hole 2210 is defined in the leg 221 in alignment with one of four mounting holes 86 of the printed circuit board 80. A cutout 222 is defined in the base portion 220 at another corner opposite to the leg 221 for preventing the heat spreader 22 from interfering with the CPU 82. The spring tab 24 has a substantially V-shaped configuration. The spring tab 24 comprises an engaging portion 240 for engaging with a top surface of the base portion 220 of the heat spreader 22. A through hole 2401 is defined in the engaging portion 240, corresponding to the central hole 2201 of the base portion 220 of the heat spreader 22. A pair of supporting arms 242 extend obliquely upwardly and outwardly from two opposite ends of the engaging portion 240. A pair of arced pressing shoulders 244 are curved downwardly from free ends of the supporting arms 242. A screw 21 is extended through the through hole 2401 of the engaging portion 240 of the spring tab 24 and threadedly engaged in the central hole 2201 of the heat spreader 22 of the second heat sink 20, so that the spring tab 24 and the heat spreader 22 are assembled together and attached to the MOSFETs 84.

Figure 4:
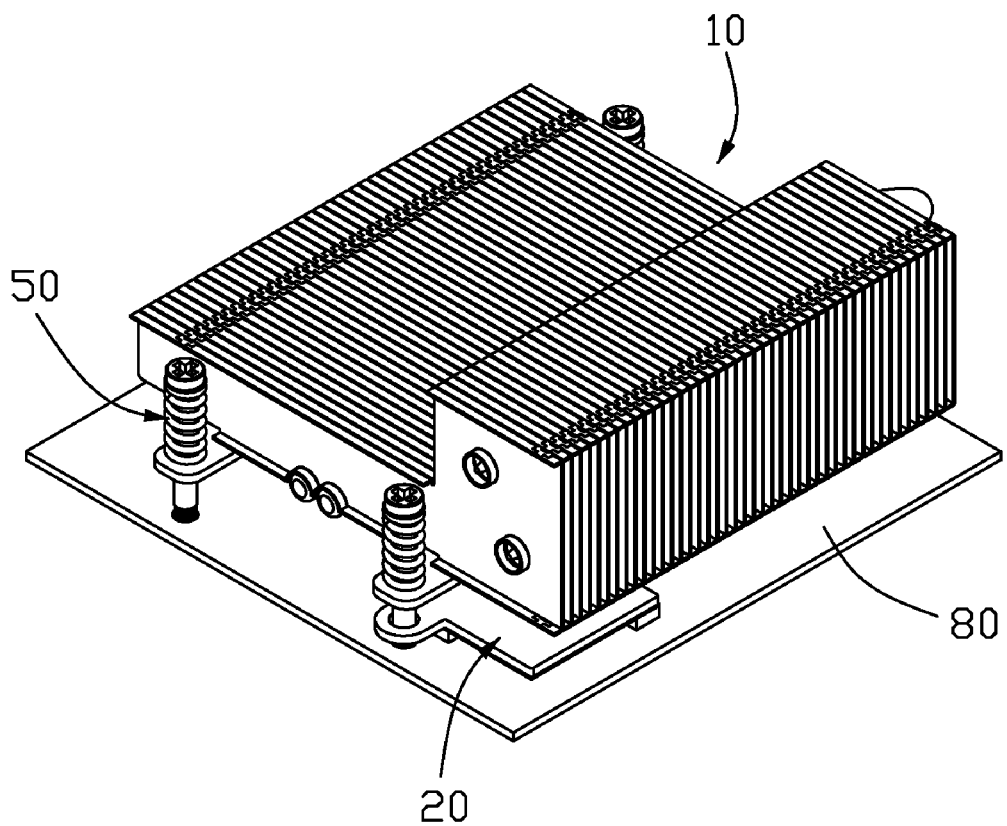
FIG. 4 is an assembled view of FIG. 1.
Figure 5:
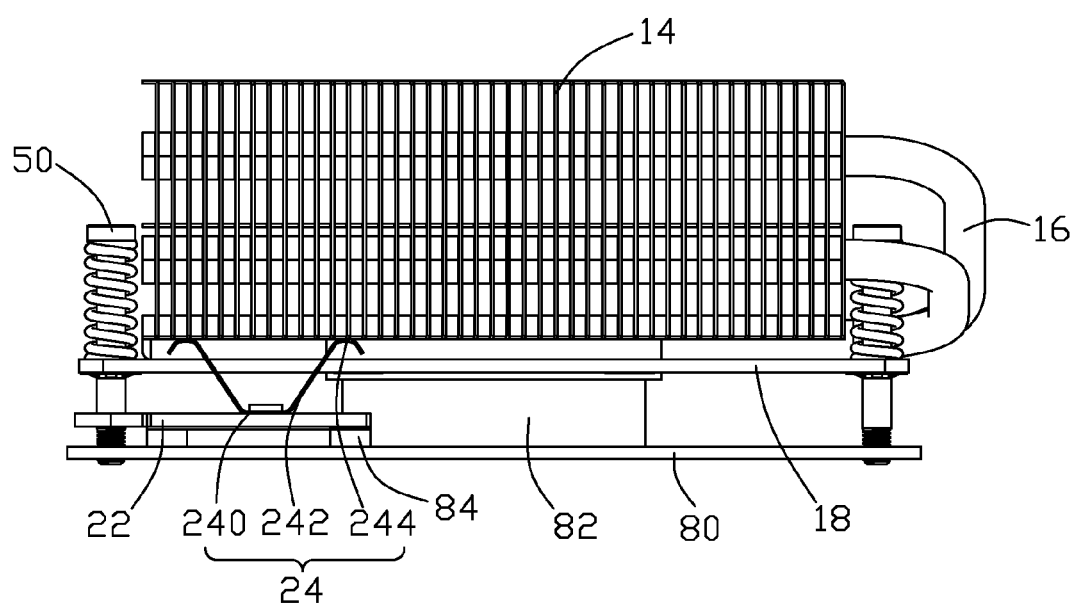
FIG. 5 is a side view of FIG. 4.

Also referring to FIGS. 4 and 5, in assembly the fasteners 50 are extended through the mounting holes of the locking members 18 of the main heat sink 10, the through hole 2210 of the heat spreader 22 of the second heat sink 20 and the four mounting holes 86 of the printed circuit board 80 in series in a manner such that the fasteners 50 are threadedly engaged with the retainer (not shown) below the printed circuit board 80. The pressing shoulders 244 of the spring tab 24 of the second heat sink 20 are pressed downwardly by the corresponding bottom portion of the fins 14. The supporting arms 242 of the spring tab 24 can adjust spring force between the main heat sink 10 and the second heat sink 20.

In the present invention, the second heat sink 20 having the spring tab 24 is provided on the MOSFETs 84 near to the CPU 82 whereby heat generated by the MOSFETs 84 can be adequately dissipated and the second heat sink 20 can be secured on the MOSFETs 84 via the spring tab 24.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipating device assembly comprising:
   a main heat sink mounted on a first heat-generating electronic component; and
   a second heat sink mounted on a second heat-generating electronic component, the second heat sink comprising a heat spreader contacting with the second heat-generating electronic component and a spring tab mounted on the heat spreader, the spring tab being sandwiched between the main heat sink and the heat spreader of the second heat sink;
   wherein the spring tab comprises an engaging portion engaging with the heat spreader, a supporting arm extending from each of two opposite ends of the engaging portion and a pressing shoulder extending from a free end of the supporting arm, the main heat sink depressing the pressing shoulders.

2. The heat dissipation device assembly as described in claim 1, wherein the engaging portion is mounted on the heat spreader via a screw.

3. The heat dissipation device assembly as described in claim 1, wherein the spring tab has a substantially V-shaped configuration.

4. The heat dissipation device assembly as described in claim 1, wherein the supporting arms extend obliquely upwardly and outwardly.

5. The heat dissipation device assembly as described in claim 1, wherein the pressing shoulders have an arced surface and contact with a bottom portion of the main heat sink.

6. The heat dissipation device assembly as described in claim 1, wherein the main heat sink comprises a base and a plurality of fins mounted on the base.

7. The heat dissipation device assembly as described in claim 6, wherein two locking members engage with the base, and a plurality of fasteners extend through the two locking members to secure the heat dissipation device to a printed circuit board.

8. The heat dissipation device assembly as described in claim 7, wherein the heat spreader of the second heat sink has a leg, and one of the plurality of fasteners extends through the leg.

9. The heat dissipation device assembly as described in claim 6, wherein the fins have an L-shaped configuration.

10. A heat dissipation device assembly mounted on a printed circuit board, the printed circuit board having a main heat-generating electronic component and an auxiliary heat-generating electronic component near to the main heat-generating electronic component, the heat dissipation device assembly comprising:
    a main heat sink in thermal contact with the main heat-generating electronic component;
    an auxiliary heat sink in thermal contact with the auxiliary heat-generating electronic component; and
    a spring tab sandwiched between the main and auxiliary heat sinks for providing spring force between the main and auxiliary heat sinks whereby the auxiliary heat sink is securely mounted on the auxiliary heat-generating electronic component;
    wherein the spring tab comprises an engaging portion engaging with the auxiliary heat sink, a supporting arm extending obliquely and upwardly from each of two opposite ends of the engaging portion and a pressing shoulder extending from a free end of the supporting arm.

11. The heat dissipation device assembly as described in claim 10, wherein the pressing shoulders are resiliently pressed by a bottom portion of the main heat sink.

12. The heat dissipation device assembly as described in claim 11, wherein the auxiliary heat sink comprises a heat spreader in contact with the auxiliary heat-generating electronic component, the spring tab being mounted on the heat spreader.

13. The heat dissipation device assembly as described in claim 10, wherein the main heat sink comprises a base, a plurality of fins mounted on the base and a heat pipe connected the base and the fins.

14. The heat dissipation device assembly as described in claim 10, wherein at least one fastener extends through the main and auxiliary heat sinks to secure the main and the auxiliary heat sinks to the printed circuit board.

15. A heat dissipation device assembly comprising:
a printed circuit board;
a main heat-generating electronic component and an auxiliary heat-generating electronic component mounted on the printed circuit board;
a first heat sink mounted on the main heat-generating electronic component and thermally connecting therewith, thereby dissipating heat generated by the main heat-generating electronic component;
a second heat sink mounted on the auxiliary heat-generating electronic component and thermally connecting therewith, thereby dissipating heat generated by the auxiliary heat-generating electronic component; wherein
the second heat sink has a V-shaped spring tab depressed by the first heat sink toward the auxiliary heat-generating electronic component so that the second heat sink has an intimate contact with the auxiliary heat-generating electronic component, the second heat sink further comprising a plate-like heat spreader on the auxiliary heat-generating electronic component, the V-shaped spring tab being sandwiched between the heat spreader and a bottom of the first heat sink.

16. The heat dissipation device assembly as described in claim 15, wherein a fastener extends through the first heat sink and the heat spreader of the second heat sink to secure the first and second heat sinks to the printed circuit board.

17. The heat dissipation device assembly as described in claim 16, wherein the main heat-generating electronic component is a CPU, while the auxiliary heat-generating electronic component is a MOSFET.

* * * * *